United States Patent
Newcomb et al.

(10) Patent No.: US 6,989,515 B2
(45) Date of Patent: *Jan. 24, 2006

(54) IMAGING STABILIZATION APPARATUS AND METHOD FOR HIGH-PERFORMANCE OPTICAL SYSTEMS

(75) Inventors: Michael A. Newcomb, San Jose, CA (US); Evan R. Mapoles, San Ramon, CA (US); David P. Gaines, Livermore, CA (US); Steve Shannon, San Jose, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/621,415

(22) Filed: Jul. 18, 2003

(65) Prior Publication Data

US 2004/0074895 A1 Apr. 22, 2004

Related U.S. Application Data

(62) Division of application No. 09/923,734, filed on Aug. 6, 2001, now Pat. No. 6,617,555.

(51) Int. Cl.
*H05B 1/02* (2006.01)

(52) U.S. Cl. ........................................ 219/494; 219/506
(58) Field of Classification Search ................ 219/201, 219/216, 494, 497, 499, 506; 346/136; 347/228; 355/30, 53, 67; 359/507, 809–811, 894; 356/492, 356/496
See application file for complete search history.

(56) References Cited

U.S. PATENT DOCUMENTS

| | | | | |
|---|---|---|---|---|
| 4,267,434 A | * | 5/1981 | Simpson | 219/494 |
| 5,602,683 A | * | 2/1997 | Straaijer et al. | 359/811 |
| 6,084,673 A | * | 7/2000 | Van Den Brink et al. | 356/492 |
| 6,256,086 B1 | * | 7/2001 | Sumiyoshi | 355/55 |
| 6,452,723 B1 | * | 9/2002 | Suenaga et al. | 359/356 |
| 6,509,951 B2 | * | 1/2003 | Loopstra et al. | 355/30 |
| 6,545,746 B1 | * | 4/2003 | Nishi | 355/53 |
| 6,617,555 B1 | * | 9/2003 | Newcomb et al. | 219/494 |
| 6,646,797 B2 | * | 11/2003 | Suenaga et al. | 359/356 |

FOREIGN PATENT DOCUMENTS

EP 0349511 * 1/1990

* cited by examiner

*Primary Examiner*—Tu Hoang
(74) *Attorney, Agent, or Firm*—Allston L. Jones

(57) ABSTRACT

An image stabilization apparatus and method for stabilizing the imaging of a high-performance optical system prone to imaging instabilities from thermal effects. Thermal instabilities within the lens, such as convection, can result in image placement errors in a high-performance optical system. The apparatus includes a heating element arranged on the upper surface of the optical system to provide heat to one or more gas-filled spaces in the optical system. An insulating blanket covers a portion of the optical system to uniformize the heating of the optical system and increase efficiency of the apparatus. The gas in the spaces is heated so that the warmer gases reside near the upper portion of the optical system, while the cooler gases reside near the lower portion of the optical system. This creates a stable thermal environment within the lens system, thereby stabilizing the imaging. Optionally gas can be flowed over the lower surface to keep heat from heating the lower portion of the optical system.

45 Claims, 4 Drawing Sheets

A CONDITION: STABILIZATION OFF
B CONDITION: STABILIZATION ON

IMAGING STABILIZATION APPARATUS AND METHOD FOR HIGH-PERFORMANCE OPTICAL SYSTEMS

CROSS REFERENCE

This application is a Divisional Application of an earlier filed application by the same title having a filing date of Aug. 6, 2001 and a Ser. No. 09/923,734 which has issued as U.S. Pat. No. 6,617,555 on Sep. 9, 2003.

BACKGROUND OF THE INVENTION

1. Field of the Invention

The present invention relates to apparatus and methods for providing image stabilization in high-performance optical systems.

2. Description of the Prior Art

Many optical systems used in manufacturing today are high-performance systems in which high-resolution images are formed. The images usually need to be imaged onto a light-sensitive medium, such as a photosensitive workpiece or a detector, with great precision.

An example of a high-performance optical system is a microlithographic projection lens. Such lenses are used in lithography systems, which are used to fabricate semiconductor devices such as microcircuits. Microlithographic projection lenses typically are required to resolve resolution-limit "critical dimension" features on a mask. Further, the images need to be accurately located on the wafer, i.e., to within nanometers of existing features.

In a lithography system, the position where a mask image (referred to as the "aerial image") is formed in the image plane can vary due to refractive index variations of the gas (e.g., air) within the spaces between the lens elements for certain types of microlithographic lenses. The index variations can be caused by lens heating, which can arise from a number of sources such as electrical and mechanical elements within the lithography system (e.g., the wafer stage linear motors). If not properly dissipated, such heat can cause a negative thermal gradient across the housing of the lens, wherein the top of the lens is cooler than the bottom of the lens. This, in turn, can cause convective heat transfer within the lens, resulting in unstable air motion within the lens and thus variations in refractive index along the optical path. If the space between lens elements is relatively large (which is the case for many catoptric and catadioptric microlithographic lens designs), such refractive index variations can significantly alter the optical path of the light rays. This, in turn, can cause slight displacements in the image at the image plane, which can lead to alignment and/or stage positioning errors, which ultimately degrade the quality of the device being fabricated.

SUMMARY OF THE INVENTION

The present invention relates to apparatus and methods for providing image stabilization in high-performance imaging systems.

Accordingly, a first aspect of the invention is an apparatus for providing image stabilization for a high-performance optical system. The apparatus includes a heating element arranged on an upper surface of a housing of the optical system. The heating elements provide heat to one or more gas-filled spaces between lens elements of the optical system. An insulating layer is arranged over at least a portion of the housing and facilitates the heating of gas present within the one or more spaces. The heating is performed so as to create a stable thermal environment within the optical system, wherein the warmer air resides closest to the upper portion of the housing and the cooler air resides closest to the lower portion of the housing.

A second aspect of the invention is that as described immediately above and further including a gas manifold is arranged adjacent the lower surface of the housing. The gas manifold is used to flow gas around the lower surface in order to prevent heating of the lower surface. The gas manifold may also be adapted to flow gas around heat-generating elements in the lithography system to prevent heat from such elements from heating the lower portion of the housing of the optical system.

A third aspect of the invention is a method of stabilizing the imaging of a high-performance optical system having one or more gas-filled spaces that are subject to thermal instability. The method includes heating the optical system so that gas in the one or more gas-filled spaces is heated so as to maintain a temperature differential within the one or more gas-filled spaces to form a stable thermal environment within the gas-filled spaces. In an example embodiment, the heating is performed on an upper surface of the optical system to avoid convective thermal instability in the one or more gas-filled spaces.

DETAILED DESCRIPTION OF THE INVENTION

The present invention relates to apparatus and methods for providing image stabilization in high-performance imaging systems.

Figure 1:
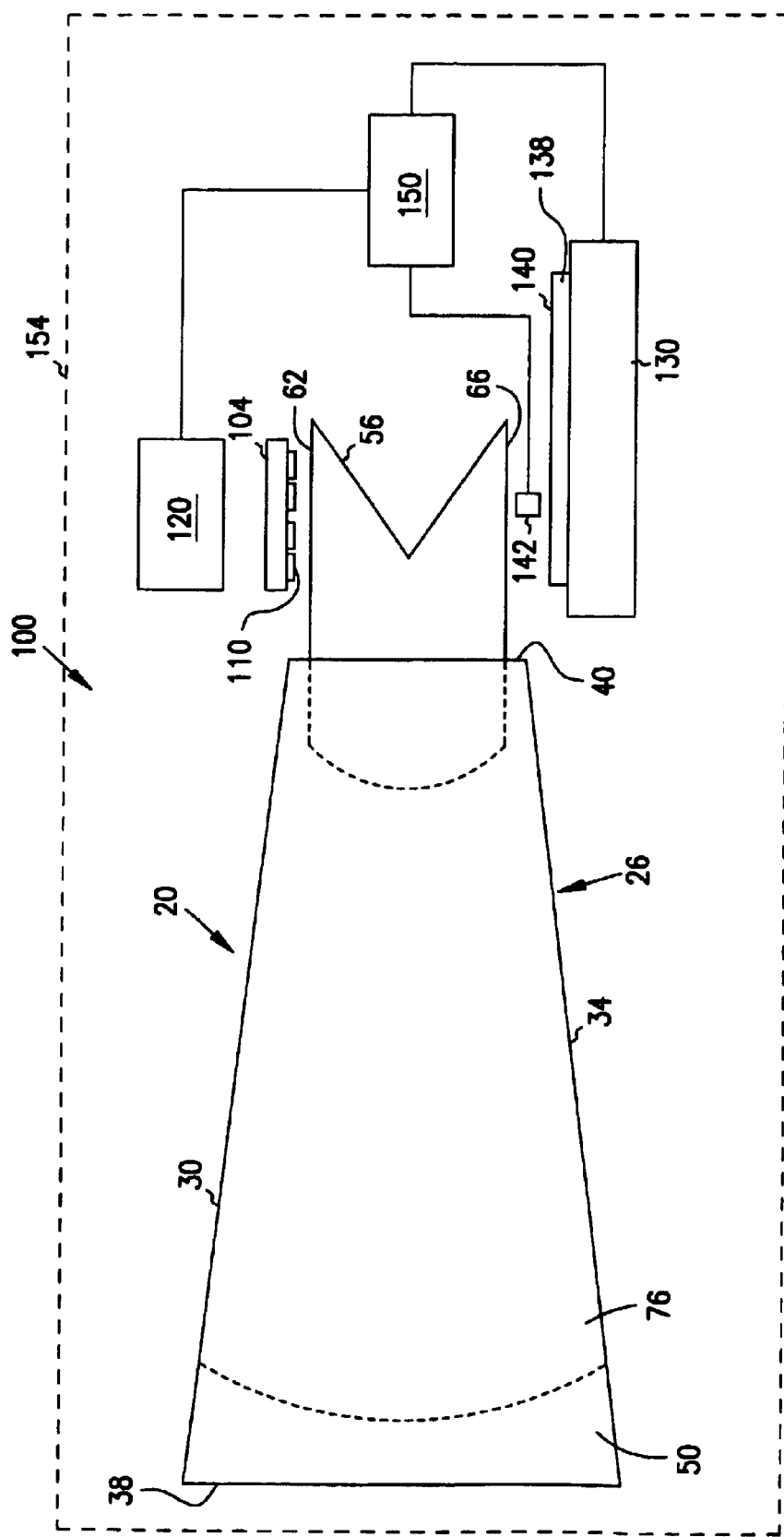
FIG. 1 is a schematic side view of an example high-performance optical system in the form of a microlithographic lens as part of a lithography system, to which the present invention may be applied.

With reference to FIG. 1, there is shown an example high-performance optical system 20 in the form of a Wynne-Dyson type microlithographic lens. Optical system 20 includes a housing 26 with an upper surface 30, a lower surface 34 and first and second ends 38 and 40, respectively. Housing 26 supports a large concave mirror 50 at first end 38 and a refractive lens assembly 56 at second end 40. Lens assembly 56 includes an upper prism surface 62 and a lower prism surface 66. A gas-filled space 76 is defined by mirror 50, lens assembly 56 and housing 26. In practice, air or another gas (e.g., helium or nitrogen) is flowed through gas-filled space 76. Also in practice, optical system 20 can have one or more gas-filled spaces 76; only one is shown in FIG. 1 for ease of explanation.

Optical system 20 is shown as part of a lithography system 100 having a mask 104 arranged adjacent upper prism surface 62. Mask 104 includes a pattern 110 to be imaged. System 100 also includes an illumination system 120 arranged adjacent mask 104 for illuminating the mask, and a workpiece stage 130 arranged adjacent lower prism surface 66 for supporting a wafer 138. Wafer 138 includes a photosensitive upper surface 140 to be exposed to an image of pattern 110. An aerial image monitor system 142 may also be included in lithography system 100 at or near wafer stage 130 to measure both the quality of the aerial image and its precise location relative to a reference position (e.g., optical system 20 or wafer stage 130). A main controller 150 is operatively connected to illumination system 120, wafer stage 130 and aerial image monitor 142, and controls the operation of lithography system 100. An environmental chamber 154 for maintaining a thermally controlled, clean environment surrounds system 100.

Figure 2:
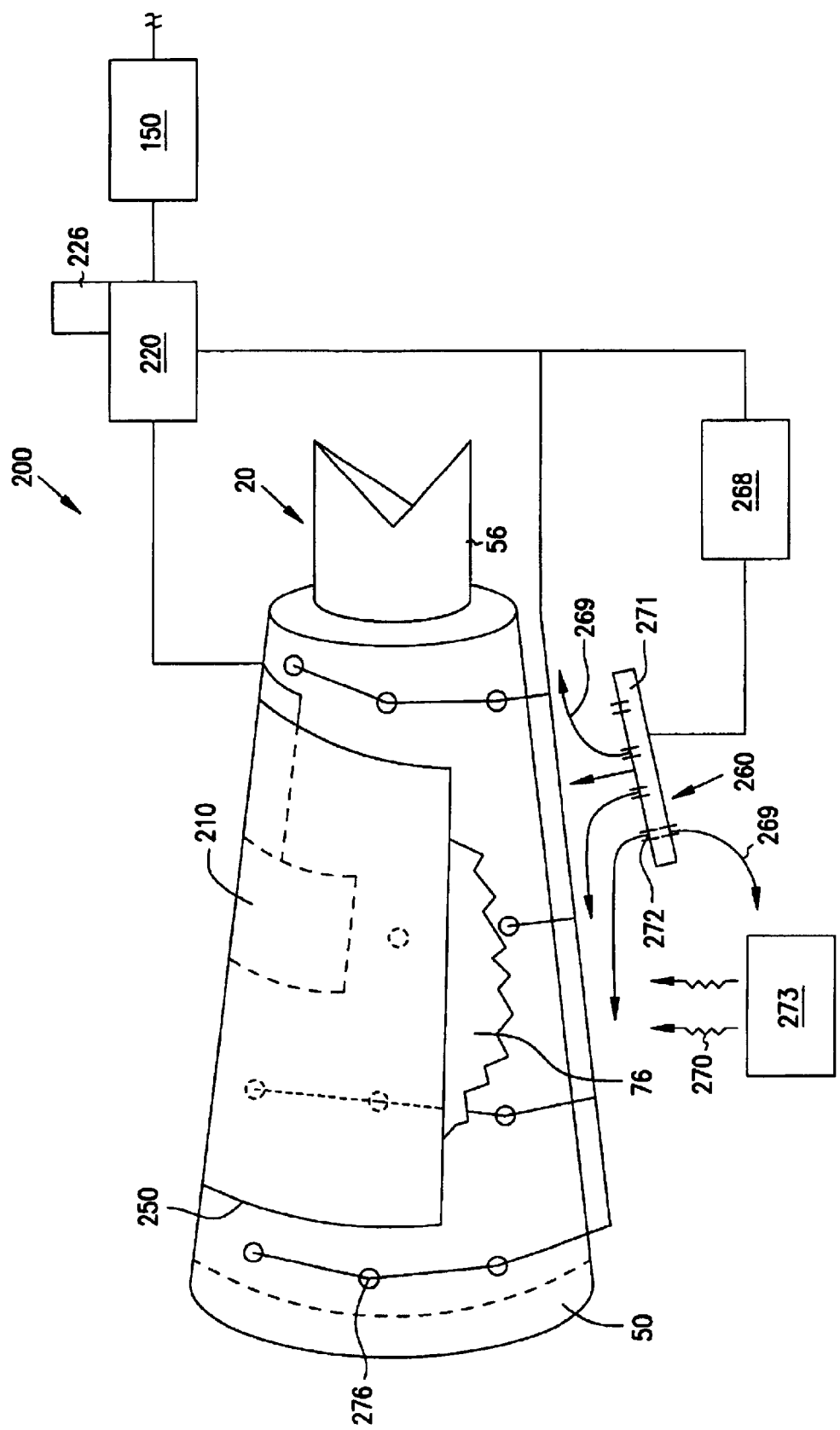
FIG. 2 is a schematic perspective diagram of the image stabilization apparatus of the present invention as applied to the high-performance optical system of FIG. 1.

With reference now to FIG. 2, there is shown the image stabilization apparatus 200 applied to optical system 20. Apparatus 200 includes a heating element 210 (shown in phantom) arranged on upper surface 30 of housing 26. Heating element 210 is, for example, a flexible heater shaped to fit upper surface 30 of housing 26. An exemplary heating element is a silicon rubber heater, such as is available from Technical Heaters, Inc., San Fernando, Calif. Heating element 210 needs to provide sufficient heat to housing 26 so that the gas in gas-filled space 76 is heated. In many applications, heating element 210 will need to provide from a few Watts up to tens of Watts of power. In an example embodiment, heating element 210 provides between 1 and 50 Watts of power. The precise amount of power that provides imaging stability without causing other imaging problems (e.g., undesirable index changes, other types of gas movements, etc.) can be determined empirically. Multiple heating elements 210 may arranged over different areas of housing 26 to facilitate the heating process.

Heating element 210 is electrically connected to a control unit 220 that controls the amount of current provided to the heating element and thus the amount of heat generated by the heating element. An indicator light 226 is optionally included on control unit 220 or elsewhere to indicate that current is flowing to heating element 210 (i.e., that the heating element is active). Control unit 220, in an example embodiment, is electrically connected to main controller 150 that controls the operation of lithography system 100 and also the operation of apparatus 200 through control unit 220.

With continuing reference to FIG. 2, apparatus 200 also includes a thermal insulating layer 250 arranged over at least a portion of housing 26 and preferably covering heating element 210. Thermal insulating layer 250 may be, for example, a blanket of flexible insulation such as Poron®, which available from Boyd Corp, Modesto, Calif. Thermal insulating layer 250 is also preferably suitable for cleanroom use. Thermal insulating layer 250 helps distribute the heat from heating element 210 over housing 26 so that the gas in gas-filled space 76 is uniformly heated. Insulating layer 250 also allows for the efficient use of heat from heating element 210 so that low power levels can be used.

Further optionally included in apparatus 200 is a gas manifold 260 arranged adjacent housing 26 near lower surface 34. Gas manifold 260 is connected to a gas source 268, such as a compressed air source or a gas cylinder. Gas manifold 260 is designed to flow gas 269 from gas source 268 over housing lower surface 34 so that heat 270 that otherwise might built up along the lower surface of the housing and create a temperature differential over the housing (and thus in gas-filled space 76) is kept away from the housing. Gas manifold 260 may include, for example, an elongate hollow structure 271 with apertures 272 formed therein to distribute gas at various locations along lower surface 34. In an exemplary embodiment, gas source 268 is an environmental chamber that surrounds lithography system 100. The air is taken from environmental chamber 154 and provided to gas manifold 260 via an air pump or fan.

Gas manifold 260, in an example embodiment, is also designed to flow air over one or more heat-generating elements 273 in lithography system 100 so that air heated by such elements can be dissipated rather than heating housing 26.

Gas manifold 260 is preferably electronically connected to main controller 150 so that-its operation can be controlled in conjunction with the operation of lithography system 100. The amount of gas flow required to maintain lower surface 34 of housing 26 at a sufficiently cool temperature is readily determined empirically. In one example, the inventors used a flow of air of 600 fpm (feet per minute) around a system similar to that illustrated in FIG. 1 and found it to be adequate.

With continuing reference to FIG. 2, also optionally included as part of apparatus 200 is an array of heat sensors 276 arranged over housing 26 and connected to control unit 220. Sensors 276 provide information about the temperature distribution over housing 26, and in particular, information about thermal gradients that may be present in the housing. Some or all of heat sensors 276 may be in communication with gas-filled space 76 so that the interior temperature of gas-filled space 76 can be measured at different locations.

Operation of Image Stabilization Apparatus

With continuing reference to FIGS. 1 and 2, apparatus 200 operates as follows. First, optical system 20 is analyzed to assess whether the imaging is unstable due to the aforementioned thermal effects that can arise within the optical system. The thermal effect that is of the greatest concern in the present invention is thermal convection in gas-filled space 76 due to lower surface 34 being at a higher temperature than upper surface 30. The heat that causes this type of temperature differential may arise from several sources, but is most likely to come from the motors that are used to drive workpiece stage 130. In certain lithography systems, linear motors in the workpiece stages can generate tens of Watts of heat, which rises and flows around optical system 20.

Figure 3:
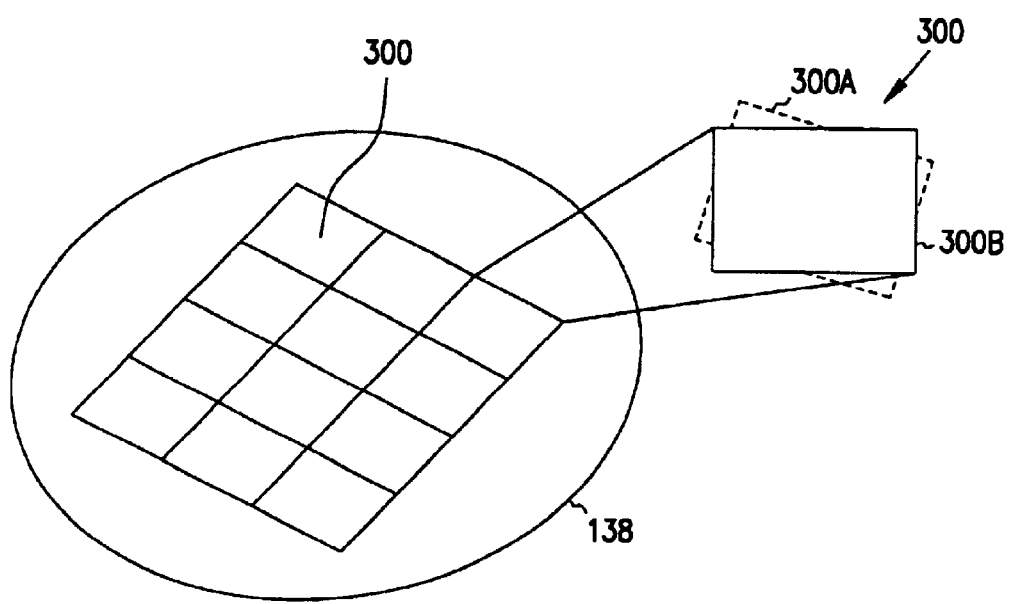
FIG. 3 is a schematic diagram of a substrate with first and second level exposure fields illustrating the type of alignment error between levels that can occur when there is an image placement error due to image instability from undesirable heating.

With reference now to FIG. 3, there is shown a workpiece 138 in the form of a wafer having a number of exposure fields 300 formed thereon. The close-up view of one of exposure fields 300 shows a first exposure field 300A from a first exposure level upon which has been exposed a second exposure field 300B associated with a second exposure level. The relative misalignment of exposure field 300A and 330B appears as an overlay error or stage precision error, but may in fact be caused by the aforementioned imaging instability of optical system 20.

In the present invention, the analysis of optical system 20 to assess whether imaging instabilities are due to thermal effects can be accomplished in number of ways. In an example embodiment, data can be taken from sensors 276 to assess the temperature distribution over housing 26. The temperature distribution tolerance for housing 26 for maintaining stable imaging can be ascertained by making temperature measurements using sensors 276 and correlating the measurements to errors in image placement that are known to be from the above-described thermal effects.

Image placement errors due to thermal effects in optical system 20 can also identified by exposing sequential layers on a wafer in a performing a stage precision test. This is done by exposing workpiece 138 with a first array of exposure fields, and then without removing the workpiece from workpiece stage 130, exposing the workpiece to form a second array of exposure fields overlaying the first. Misalignment between the two exposure field arrays, as illustrated in FIG. 3, can be attributed to image instability, assuming that workpiece stage 130 is operating properly.

Another technique that can be used to deduce imaging instabilities involves using aerial image monitor 142 to perform image placement measurements. This information is fed to and stored in control unit 220.

Figure 4:
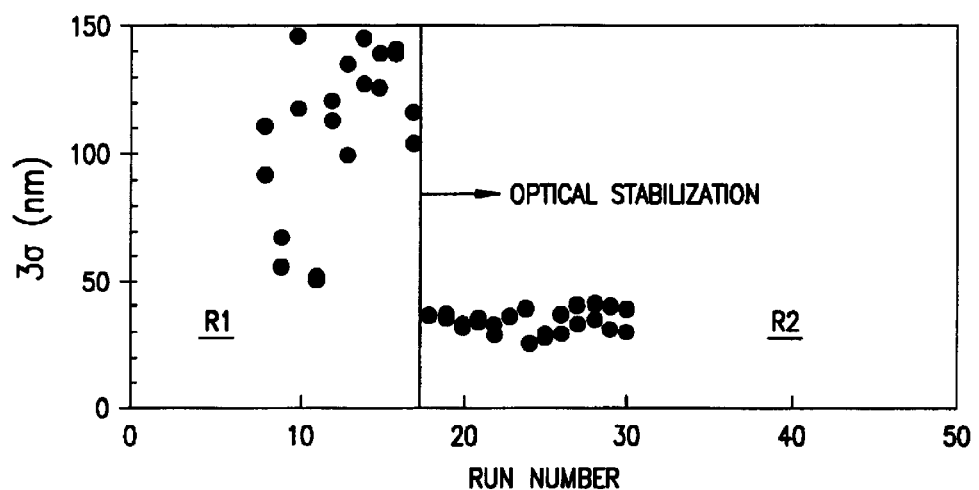
FIG. 4 is a plot of the stage precision test 3σ (nm) as measured for different wafers both before image stabilization (region R1) and after stabilization (region R2)

With reference now to FIG. 4, there is shown measurements of the precision of workpiece stage 130 for performing alignment on a number of different workpieces. Region R1 of the plot shows measurements taken prior to implementing an image stabilization method using the image stabilization apparatus 200.

Once it is determined that the conditions that lead to imaging instability in optical system 20 exist, then control unit 220 activates heating element 210 by providing an electric current thereto. The flow of electric current also activates optional indicator light 226, indicating that apparatus 200 is activated. Heat from heater element 210 diffuses over housing 26 and into gas-filled space 76, thereby heating the gas within the gas-filled space. Insulating layer 250 insulates the portion of housing 26 that it covers and so assists in uniformly diffusing the heat. The heating of the gas in airspace 76 through upper surface 30 of housing 26 creates a stable thermal environment within optical system 20, i.e., it reduces the unstable (e.g., convective) motion of gas within gas-filled space 76

Optionally, control unit 220 also activates gas supply 268 to supply gas to gas manifold 260 to initiate the flow of gas over lower surface 34 of housing 26. The combination of heating upper surface 30 with heating element 210 and cooling lower surface 34 with gas flow from gas manifold 260 further enhances the formation of a stable thermal environment in the gas within gas-filled space 76. In addition, the flow of gas from gas manifold 260 may be directed over heat-generating elements 273 to remove heat from those elements that could otherwise heat lower surface 34 of housing 26.

With reference again to FIG. 4, region R2 of the plot includes measurements taken after the image stabilization method of the present invention was implemented using apparatus 200. As can be seen by comparing region R1 to region R2, activation of image stabilization apparatus 200 greatly reduced the variation in the stage precision test that arose from imaging instabilities.

It is important that the use of apparatus 200 to fix one type of an imaging instability problem not lead to the introduction of another type of imaging instability. For example, many high-performance optical systems 20, and particularly microlithographic lenses, need to have stable magnification to within a few parts per million (ppm). The magnification of a high-performance optical system can be sensitive to small changes in the refractive index in the gas-filled spaces 76, or to changes in the internal lens mounting structure. Thus, it important that the amount of heating (and optionally, gas flow) provided to housing 26 not lead to an overall change in the imaging properties of optical system 20 (e.g., changes in the refractive index of the gas occupying gas-filled space 76).

Figure 5:
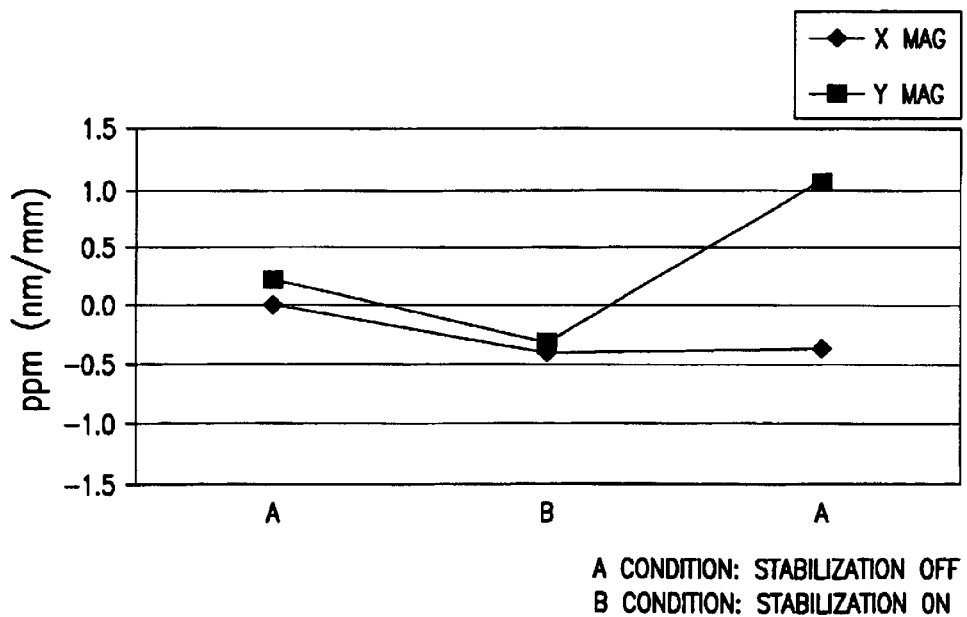
FIG. 5 is a plot of magnification of an example microlithographic projection lens with and without the image stabilization apparatus of the present invention, the data showing no detrimental effects on the image performance of the optical system when the image stabilization apparatus is used.

With now reference to FIG. 5, there is shown a plot of the magnification (in ppm) for X and Y magnification of a high-performance optical system taken with and without apparatus 200 being activated. As can be seen from FIG. 5, optical stabilization is achieved without introducing significant magnification changes or other detrimental imaging effects As mentioned above, the amount of heat (or heat plus gas flow) required to stabilize the imaging without introducing other imaging problems may need to be determined empirically, and will likely vary between optical systems.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

What is claimed is:

1. An apparatus to provide image stabilization for a high-performance optical system, the apparatus comprising:
    lens elements in a housing with one or more gas-filled spaces between the lens element; and
    a heater arranged on an upper surface of the housing to provide a small thermal gradient with temperature changes in a vertical direction in the one or more gas-filled spaces between the lens elements.

2. An apparatus according to claim 1 further includes an insulation layer arranged over at least a portion of the housing and arranged to facilitate the temperature changes of the gas present within the one or more gas filled spaces to create a stable thermal environment within the optical system.

3. An apparatus according to claim 1 further includes a gas manifold arranged adjacent a surface of the housing to flow gas around the housing surface to maintain a higher temperature on the upper surface of the housing than on the lower surface of the housing.

4. An apparatus according to claim 1 further includes a gas manifold to flow gas around the heater and located below the housing to prevent heating a lower surface of the housing to a temperature above the temperature on the upper surface of the housing.

5. An apparatus according to claim 1 further includes a control unit electrically connected to the heater to control the amount of heat generated by the heater.

6. An apparatus according to claim 5 further includes an indicator light coupled to the control unit to indicate when the heater is activated.

7. An apparatus according to claim 1 wherein the heater supplies between about 1 and 50 Watts of power.

8. An apparatus according to claim 3 wherein the gas manifold includes a hollow member with a plurality of apertures formed therein to provide distributed gas flow.

9. An apparatus according to claim 2 wherein the insulating layer includes a blanket of flexible insulation.

10. An apparatus according to claim 5 further Includes an array of thermal sensors arranged over the housing in electrical communication with the control unit to provide temperature information of the housing to the control unit.

11. An apparatus according to claim 5 further includes an array of thermal sensors arranged over the housing and in communication with the one or more spaces, and in electrical communication with the control unit, to provide temperature information of the gas in the one or more gas-filled spaces to the control unit.

12. An apparatus according to claim 2 wherein the insulating layer covers the heater.

13. An apparatus according to claim 1 wherein the gas in the one or more gas-filled spaces is air.

14. An apparatus to provide image stabilization for a high-performance optical system, the apparatus comprising:
    lens elements in a housing with one or more gas-filled spaces between the lens elements; and
    a gas manifold adjacent a lower surface of the housing to flow gas to said housing to provide a small thermal gradient in the vertical direction in the one or more gas-filled spaces between the lens elements.

15. An apparatus according to claim 14 further includes an insulating layer arranged over at least a portion of the housing and arranged to facilitate the temperature changes of the gas present within the one or more filled spaces to create a stable thermal environment within the optical system.

16. An apparatus according to claim 14 wherein said a gas manifold is positioned to flow gas around the housing surface to maintain a higher temperature on the upper surface of the housing than on the lower surface.

17. An apparatus according to claim 15 further includes heat generating elements and wherein said gas manifold flows gas over and around the heat generating elements to prevent heating of a lower surface of the housing to a temperature above the temperature on the upper surface of the housing.

18. An apparatus according to claim 14 further includes a gas source coupled to said gas manifold and a control unit electrically connected to the gas source to control the gas flow from the gas source.

19. An apparatus according to claim 18 further includes an indicator light coupled to the control unit to indicate when the gas source is activated.

20. An apparatus according to claim 17 wherein the gas manifold includes a hollow member with a plurality of apertures formed therein to provide distributed gas flow.

21. An apparatus according to claim 15 wherein the insulating layer includes a blanket of flexible insulation.

22. An apparatus according to claim 18 further includes an array of thermal sensors arranged over the housing in electrical communication with the control unit to providing temperature information of the housing to the control unit.

23. An apparatus according to claim 18 further includes an array of thermal sensors arranged over the housing and in communication with the one or more gas filled spaces, and in electrical communication with the control unit, to provide temperature information of the gas in the one or more gas-filled spaces to the control unit.

24. An apparatus according to claim 15:
    further includes a heater arranged on an upper surface of the housing to provide a small thermal gradient with temperature increases in a vertical direction in the one or more gas-filled spaces between the lens elements; and wherein the insulating layer covers the heater.

25. An apparatus according to claim 14 wherein the gas in the one or more gas-filled spaces is air.

26. A lithography system to pattern a wafer with an image of a mask, comprising:
    an illumination system to irradiate the mask;
    a microlithographic lens with one or more lens elements, and a housing to house the lens elements and to define one or more gas-filled spaces between the lens elements;
    a heater arranged on an upper surface of the housing to provide a small thermal gradient with temperature increases in a vertical direction in the one or more gas-filled spaces between lens elements; and
    a wafer stage to support the wafer to be exposed with the image.

27. A system according to claim 26 further includes an insulation layer arranged over at least a portion of the housing and arranged to facilitate the temperature change of gas present within the one or more spaces to create a stable thermal environment within the one or more spaces.

28. A system according to claim 26 wherein the gas in the one or more gas-filled spaces is air.

29. An system according to claim 26 further includes a gas manifold arranged adjacent a surface of the housing to flow a gas around the surface to maintain a higher temperature on the upper surface of the housing than on a lower surface.

30. An system according to claim 26 further includes a gas manifold located below the housing to flow gas around the housing and to prevent heating a lower surface of the housing to a temperature above the temperature on the upper surface of the housing.

31. An system according to claim 26 further includes a control unit electrically connected to the heater to control the amount of heat generated by the heater.

32. A lithography system to pattern a wafer with an image of a mask, comprising:
    an illumination system to irradiate the mask;
    a microlithographic lens with one or more lens elements, and a housing to house the lens elements and to define one or more gas-filled spaces between the lens elements;
    a gas manifold adjacent a lower surface of the housing flows gas around said housing to provide a small thermal gradient in a vertical direction in the one or more gas-filled spaces between lens elements; and
    a wafer stage to support the wafer to be exposed with the image.

33. A system according to claim 32 further includes an insulation layer arranged over at least a portion of the housing and arranged to facilitate the temperature change of gas present within the one or more spaces to create a stable thermal environment within the one or gas filled more spaces.

34. A system according to claim 32 wherein the gas in the one or more gas-filled space spaces is air.

35. An apparatus according to claim 32 wherein said gas manifold is position to flow a gas around the housing surface to maintain a higher temperature on an upper surface of the housing than on a lower surface of the housing.

36. An apparatus according to claim 32 further includes heat generating elements and wherein said gas manifold flow gas over and around the heat generating elements to prevent heating the lower surface of the housing to a temperature above the temperature on an upper surface of the housing.

37. An apparatus according to claims 32 further includes a gas source coupled to said gas manifold and a control unit electrically connected to the gas source to control the gas flow from the gas source.

38. A method for stabilizing the imaging of a high-performance optical system subject to thermal instability, comprising the step of:
    heating a top portion of an optical system or cooling a bottom portion of the optical system having one or more gas-filled spaces so that gas in the one or more gas-filled spaces has a temperature gradient that increases the temperature from the bottom to the top of the optical system to form a stable thermal environment within the gas-filled spaces.

39. A method according to claim 38, further including the step of flowing gas over and around one or more heat-generating elements to prevent heat from the one or more heat-generating elements from heating the bottom portion of the optical system to a temperature above the temperature on the top portion of the optical system.

40. A method according to claim 38, further including the step of detecting image instability in the optical system.

41. A method according to claim 40 wherein the step of detecting image stability includes the step of measuring the temperature gradient across the one or more gas filled spaces of the optical system.

42. A method according to claim 40, wherein the step of detecting imaging instability includes the step of measuring locations of images from the optical system at different times.

43. A method according to claim 42, further including the step of measuring overlay errors between first and second level exposure fields.

44. A method according to claim 42, further including the step of using an image position monitor to measure changes in the image locations.

45. A method according to claim 38, wherein the heating or cooling is carried out without significantly changing magnification of the optical system.

* * * * *